(12) United States Patent
Gaynor

(10) Patent No.: US 10,601,376 B2
(45) Date of Patent: Mar. 24, 2020

(54) INPUT THIRD ORDER INTERCEPT POINT IN LOW NOISE AMPLIFIER WITH DEGENERATION TANK CIRCUIT

(71) Applicant: pSemi Corporation, San Diego, CA (US)

(72) Inventor: Michael P. Gaynor, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/925,491

(22) Filed: Mar. 19, 2018

(65) Prior Publication Data

US 2019/0288649 A1    Sep. 19, 2019

(51) Int. Cl.
| | | |
|---|---|---|
| H03G 9/24 | (2006.01) |
| H03F 1/26 | (2006.01) |
| H03F 3/193 | (2006.01) |
| H03F 1/56 | (2006.01) |
| H04B 1/16 | (2006.01) |

(52) U.S. Cl.
CPC .............. *H03F 1/26* (2013.01); *H03F 1/565* (2013.01); *H03F 3/193* (2013.01); *H04B 1/16* (2013.01); *H03F 2200/222* (2013.01); *H03F 2200/294* (2013.01); *H03F 2200/451* (2013.01)

(58) Field of Classification Search
CPC .............. H03F 1/22; H03F 1/223; H03G 9/24
USPC .................................................. 330/283, 311
See application file for complete search history.

(56) References Cited

U.S. PATENT DOCUMENTS 9,035,703 B2 * 5/2015 Feng ........................ H03F 1/223
330/302

OTHER PUBLICATIONS

Rauscher, Christoph, "Fundamentals of Spectrum Analysis", Rohde & Schwarz GmbH & Co., Muchen, Germany, Sixth Edition 2008, 208 pgs.
Zhang, et al., "Linearization Techniques for CMOS Low Noise Amplifiers: A Tutorial", IEEE Transactions on Circuits and Systems—I: Regular Papers, vol. 58, No. 1, Jan. 2011, pp. 22-36 (15 pgs).

* cited by examiner

*Primary Examiner* — Steven J Mottola
(74) *Attorney, Agent, or Firm* — Jaquez Land Greenhaus LLP; Bruce W. Greenhaus, Esq.

(57) ABSTRACT

A receiver front end having low noise amplifiers (LNAs) with enhanced input third order intercept point is disclosed herein. A cascode having a "common source" configured input FET and a "common gate" configured load FET have a degeneration circuit comprising a tank circuit tuned to a harmonic of the operating frequency.

19 Claims, 14 Drawing Sheets

INPUT THIRD ORDER INTERCEPT POINT IN LOW NOISE AMPLIFIER WITH DEGENERATION TANK CIRCUIT

BACKGROUND

(1) Technical Field

Various embodiments described herein relate to RF front ends and more particularly to low noise amplifiers for use in communications equipment.

(2) Background

Many modern electronic systems include radio frequency (RF) transceivers; examples include personal computers, tablet computers, wireless network components, televisions, cable system "set top" boxes, radar systems, and cellular telephones. Many RF transceivers are quite complex two-way radios that transmit and receive RF signals across multiple frequencies in multiple bands using one or more signaling protocols. As an example, a modern "smart telephone" may include RF transceiver circuitry capable of operating on different cellular communications systems (e.g., GSM and LTE), on different wireless network frequencies and protocols (e.g., IEEE 802.1bg at 2.4 GHz, and IEEE 802.1n at 2.4 GHz and 5 GHz), and on "personal" area networks (e.g., Bluetooth based systems).

The front end of a communications receiver within any such transceiver typically includes a low noise amplifier ("LNA") that is responsible for providing the first stage amplification to a signal received within the communications receiver. FIG. 1 is a simplified schematic of front end amplifier 100 comprising an LNA 101 that might be used in the front end of a communications receiver. The LNA 101 has a signal input 108, a signal output 118, a supply current input 119, and a supply current output 121. The LNA 100 is configured as a cascode amplifier having two transistors 102, 104. The first transistor 102 is configured as a "common source" input transistor (e.g., input field effect transistor (FET) 102). The second transistor 104 is configured in a "common gate" configuration as an output transistor, (e.g. load FET 104). In other embodiments, the LNA 101 may have additional transistors (i.e., two or more stages and/or stacked transistors), not shown in FIG. 1 for the sake of simplicity. The LNA 101 can be turned on or off by a signal applied to a control input terminal 106 coupled to the gate of the load FET 104. Input signals to be amplified are applied though a signal input 108 to the gate of an input FET 102. In one case, an input matching circuit 110 is coupled to the signal input 108. The signal input 108 is coupled to the gate of the input FET 102. The input matching circuit 110 provides an impedance match between the input impedance of the front end amplifier 100 and the impedance seen at the gate of input FET 102. In the example shown in FIG. 1, the input matching circuit 110 includes an input matching inductor 112 and an input DC block capacitor 114.

A VDD supply voltage source 126 is coupled to the supply current input 119 and supplies a drain current through the LNA 101. In some cases, a supply bypass shunt capacitor 120 is coupled between the supply current input 119 and the first terminal of the output load matching circuit 116. The supply bypass shunt capacitor 120 provides a relatively low capacitive reactance to ground for signals in the frequency range of the input signals applied to the input of the LNA 101. In the example front end amplifier 100, a three-port output load matching circuit 116 is coupled between a supply current input 119 of the LNA 101, the drain of the load FET 104 and the signal output 118. The output load matching circuit 116 provides a means by which the output impedance of the LNA 101 can be matched to a load (not shown) coupled to the signal output 118. In the front end amplifier 100, the output load matching circuit 116 comprises an inductive element 122 in parallel with a capacitive element 123 coupled between supply current input 119 and the drain of the load FET 104. A capacitive element 128 is coupled between the drain of the load FET 104 and the LNA signal output 118. The amplified output signal is coupled through the capacitive element 128 to the signal output 118.

A degeneration inductor 124 is coupled between the supply current output 121 and ground. The degeneration inductor 124, together with the gate-to-source capacitance $C_{gs}$ of the input transistor 102, are major contributors to the input impedance of the front end amplifier 100.

Typically, the size of the FETs 102, 104 and the amount of bias current are optimized to minimize the overall noise figure of the front end amplifier 100. In addition, current consumption of the front end amplifier 100 may be taken into account in determining the bias current selected.

The sensitivity of a receiver is, in large part, determined by the quality of the front end and in particular, by the quality of the LNA. Nonlinearity in the LNA introduces distortion to the amplified input signal. Because the LNA is the first block in the receive chain of the receiver, any noise or distortion in the input to the LNA will cause degradation of the overall receiver performance. Therefore, the linearity of the LNA is an important design parameter to be considered when designing a receiver that is intended to have a wide dynamic range. Accordingly, maintaining a high third order intercept measured at the input (IIP3) in the LNA is very important to the overall quality of a communications receiver. The third-order intercept point is a comparative metric used to define the third order product behavior of an amplifier. The IIP3 is a single value that indicates the point (with reference to the input signal level) at which the third order intermodulation product ($IM_3$) at the output of the device intersects with the level of the fundamental at the output. However, the IIP3 can be used in a well-known mathematical relationship to determine the expected $IM_3$ that result from applying an input at any specific input signal level (Psig), as follows:

$$3 * P\text{sig (per tone)} - 2 * IIP3 = IM_3 \text{ (dBm)} \qquad \text{EQ. 1}$$

The intercept point is a mathematical extrapolation that maps the fundamental and the intermodulation product responses against an ever increasing input signal. The input signal level at which these two linearly extrapolated curves intersect determines the intercept point. For example, the input signal level at the point of intersection of the fundamental and the $IM_3$ at the output defines the IIP3. This point does not necessarily correspond to any practically occurring physical power level. Rather, it is a numerical constant that, for a given amplifier, is used to relate the input signal level to the expected $IM_3$ generation.

To determine the IIP3 for a specific amplifier, two sinusoidal tones, the first having a frequency that is slightly greater than the second, are applied to the input of the LNA. The $IM_3$ then appears at three times the frequency of one tone, minus two times the frequency of the other tone (i.e., $3f_1-2f_2$ and $3f_2-2f_1$). The IIP3 is determined by applying the $IM_3$ to EQ. 1. This two tone approach has the advantage of not being restricted to an LNA that has sufficient gain at n times the frequency of the fundamental signal.

A second nonlinearity intercept point is referred to as the Harmonic Intercept point. In accordance with this definition, a single input tone is applied to the input of the LNA. The nonlinear products caused by the nth order nonlinearity appear at n times the frequency of the input tone and have a power curve that is linear in decibels with a slope at the output that is n times that of the linear output of the LNA. The point at which the amplitude of the nth order product intersects the first order signal is the nth order Harmonic Intercept point. Second and Third Harmonic Intercept points (SHI and THI) are two commonly used Harmonic Intercept points.

Some of the factors that determine the IIP3 of an LNA include the output impedance match, the device size and the bias conditions (i.e., the amount of bias required to operate the LNA at the desired operating point). In many designs, the device size and the bias current are set to optimize the noise figure of the LNA. In addition, the bias conditions are typically set to minimize the current consumption of the LNA. Having a relatively low bias current typically results in a lower IIP3. Still further, the output impedance is typically optimized, leaving a choice between sacrificing higher noise figure in order to raise the IIP3 or increasing the bias current, and thus the total current consumption.

In light of the tradeoffs between the alternatives currently available for increasing the IIP3 of the LNA, it would be desirable to provide a way to improve IIP3 without having to either increase the current consumption or increase the noise figure of the LNA.

SUMMARY OF THE INVENTION

A receiver front end is disclosed herein having a low noise amplifier (LNA) with relatively high third order intercept measured at the input (IIP3), low power consumption and low noise figure. In accordance with some embodiments of the disclosed method and apparatus, the LNA is configured as a cascode, similar to that shown in FIG. 1 and discussed above. That is, the LNA has two stacked transistors. The first transistor is configured as a "common source" input transistor, e.g., input field effect transistor (FET). The second transistor is a load transistor, (e.g. load FET) configured in a "common gate" configuration. In other embodiments, the LNA may have additional transistors (i.e., more than two stages and/or stacked transistors). The LNA can be turned on or off using the gate of the common gate FET. Input signals are applied to the gate of an input FET. The size of the FETs and the bias current are optimized to minimize the noise figure. In addition, the bias current may be selected to minimize the current consumption of the LNA.

In order to increase the IIP3, a tank circuit is placed in the path of the FET source current (e.g., coupled between the source of the input FET and ground). The components of the tank circuit are selected to have an inductive reactance at the desired operating frequency that makes it relatively easy to match the input impedance of the LNA at the desired operating frequency. However, at the third harmonic of the operating frequency, the tank circuit has a relatively high impedance and in some cases, serves as a virtual open circuit. Accordingly, the LNA will have a noise figure similar to conventional LNAs at the operating frequency having: (1) devices optimized in size for the lowest noise figure; (2) bias current optimized to provide a desired noise figure; and (3) bias current optimized for reduced current consumption. Concurrently, the tank circuit provides the LNA with a IIP3 that is substantially higher than that of a conventional LNA due to the relatively high impedance placed in the path of the drain current at the third harmonic of the operating frequency.

This concept can be expanded to cover additional intercept points, such as the second order intercept point (IP2). In some devices, such as direct conversion receivers, having a tank circuit that is tuned the second harmonic to improve the IP2 can be advantageous. Furthermore, in some embodiments, two or more tank circuits can be provided in series, each tuned to a different frequency to impose a high impedance at the tuned frequency. In such cases, each tank circuit can be tuned for one of the frequencies of interest, such as the second harmonic, third harmonic and higher harmonics. The components of the combination of the tank circuits would further be tuned to have a combined impedance that is equal to the desired impedance (e.g., the inductance of an inductor that they replace) at the operating frequency.

In another embodiment, a second stage LNA can be provided. A second degeneration circuit can be coupled to the current supply output of the second stage LNA.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 2A:
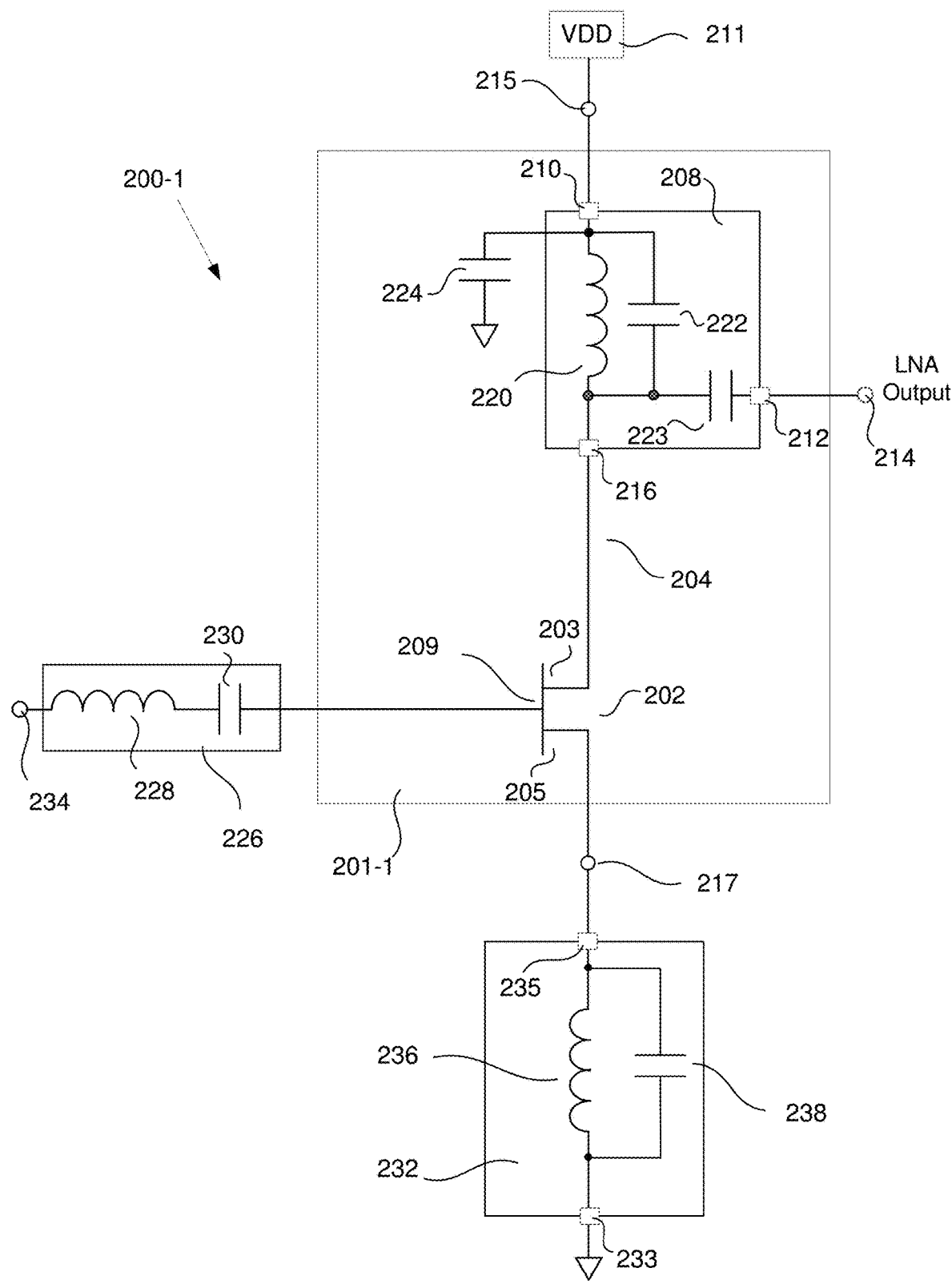
FIG. 2A is an illustration of a front end amplifier of a communications receiver having a tank circuit replacing the source inductor of FIG. 1 to enhance the input third order intercept point (IIP3).

FIG. 2A is a simplified schematic of a front end amplifier 200-1 of a communication receiver having an enhanced input third order intercept point (IIP3). In some embodiments of the disclosed method and apparatus, the front end amplifier 200 comprises a low noise amplifier (LNA) 201-1. The LNA 201-1 has a signal input 234, a signal output 214, a supply current input 215 and a supply current output 217. The LNA 201-1 comprises a transistor 202. In some such embodiments, the transistor is a field effect transistor (FET) 202. However, it will be understood by those skilled in the art that other types of transistors may be used, including, but not limited to, bipolar junction transistors. Furthermore, any type of FET may be used to implement the LNA 201-1, including, but not limited to metal-oxide semiconductors (MOSFETs), junction field effect transistors (JFETs), insulated gate FETs (IGFETs), metal semiconductor FETs (MESFETs), etc. While some types of transistors may be better suited to particular applications, the concepts associated with the disclosed method and apparatus do not exclude the use of any particular type of transistor. Still further, additional transistors can be included within the LNA 201-1, either as additional amplifier stages or stacked with those FETs 202, 204 that are shown in FIG. 2A, as discussed below.

As shown in FIG. 2A, the transistor 202 forms an LNA. It should be noted that for many types of FETs, the designation of "source" and "drain" may be more a matter of the function of the elements of the FET than of the manner in which the FET is fabricated. Accordingly, the designation of source and drain may be interchangeable for some FETs.

In some embodiments, a three-port output load matching circuit 208 provides a means by which the output impedance of the LNA 201-1 can be matched to a load. A first connection 210 to the output load matching circuit 208 is coupled to the supply current input 215. The supply current input 215 is coupled to VDD (i.e., the power source) 211. A second connection 212 to the output load matching circuit 208 is coupled to the LNA signal output 214. A third connection 216 of the output load matching circuit 208 is coupled to the drain 218 of the load FET 204. It should be noted that throughout this description, the terms "port" and "terminal" are used merely to refer to particular points in the circuit and are not necessarily intended to imply any particular physical structure associated with such port or terminal.

In some embodiments, the output load matching circuit 208 comprises an inductor 220 in parallel with a capacitor 222. A capacitive element 223 is coupled between the drain 218 of the load FET 204 and the LNA signal output 214. The amplified output signal is coupled through the capacitive element 223 to the signal output 214. In some embodiments, a supply bypass shunt capacitor 224 provides a relatively low capacitive reactance to ground for signals in the frequency range of the input signals applied to the input of the front end amplifier 200-1. In some embodiments, an input matching circuit 226 is also provided to match the input impedance of the front end amplifier 200 to an input signal source (not shown). The input matching circuit 226 includes an input matching inductive element 228 and an input DC blocking capacitive element 230.

The input impedance of the front end amplifier 200-1 is due to the series combination of a gate-to-source capacitance, $C_{gs}$, of the input FET 202 in series with the impedance of a degeneration circuit 232, such as a tank circuit in one embodiment. Alternatively, the filter may be a band-pass filter that passes the operating frequencies and presents a high impedance to the frequencies for which the gain of the amplifier is to be suppressed. In some embodiments, the impedance in the pass band is equal to the inductance of a degeneration inductor commonly used in an amplifier, such as the amplifier 100 of FIG. 1.

In some embodiments in which the degeneration circuit 232 is a tank circuit, the tank circuit has a first terminal 233 coupled to ground and a second terminal 235 coupled to the supply current output 217. The supply current output 217 is coupled to the source 205 of the input FET 202. A mismatch between the impedance of the input signal source and the front end amplifier 200-1 within the operating frequency range of the front end amplifier 200-1 creates detrimental effects on virtually every aspect of the operation of the front end amplifier 200-1. Therefore, it is useful to match the input impedance of the front end amplifier 200-1 to the impedance of the input signal source. In some embodiments, this is done by ensuring that the input impedance of the front end amplifier 200-1 as seen looking into the signal input 234 is equal to the operating impedance of the system in which the front end amplifier 200-1 is being used, assuming the output impedance of the input signal source is also equal to the operating impedance. In some cases, the operating impedance is 50 Ohms.

The effect of an input impedance mismatch is an increase in noise figure, a reduction in gain, and a degradation in linearity as, for example, measured by IIP3. In accordance with some embodiments of the disclosed method and apparatus, the tank circuit of the degeneration circuit 232 includes at least a first inductive element 236 and at least a first capacitive element 238. The tank circuit of the degeneration circuit 232 is placed between the supply current output 217 and ground. The supply current output 217 is coupled to the source 205 of the input FET 202. The inductance of the inductive element 236 and the capacitance of the capacitive element 238 are selected such that the total impedance at the operating frequency looking into the front end amplifier 200-1 is equal to the operating impedance (e.g., 50 Ohms, in some embodiments). That is, in a system in which the operating impedance is 50 Ohms, the series combination of: (1) the input impedance matching circuit 226; (2) the gate-to-source impedance through the input FET 202; and (3) the tank circuit of the degeneration circuit 232, at the operating frequency, has an impedance that is equal to 50 Ohms. In some embodiments, the tank circuit of the degeneration circuit 232 has an inductive reactance at the operating frequency to offset the series capacitive reactance of $C_{gs}$ and the input impedance matching circuit 226. Furthermore, the impedance of the tank circuit of the degeneration circuit 232 is relatively high at the third harmonic of the operating frequency.

By providing a resonant tank circuit within the degeneration circuit 232 having a resonant frequency at or near the third harmonic, the gain of the front end amplifier 200-1 at the third harmonic of the operating frequency is substantially reduced. This in turn substantially increases the IIP3 of the front end amplifier 200-1, since the gain at the third order harmonic directly affects the level of the IIP3. This can be seen from Table 1, which shows the mixture products for a two-tone input. That is, the gain, $a_3$ of the third harmonic is also present in the overall gain of the third order intermodulation product. By suppressing the gain $a_3$ with a resonant tank circuit, the overall magnitude of the third order intermodulation product is also suppressed. In the equations shown in Table 1, the variables are defined as follows:

$a_1$=gain of fundamental;
$a_2$=gain of the second order term;
$a_3$=gain of the third order term;
$\hat{U}_{in,1}$=The peak of the first signal applied to the input;
$\hat{U}_{in,2}$=The peak of the second signal applied to the input;
$\omega_1 t$=radial velocity of the first input signal;
$\omega_2 t$=radial velocity of a second input signal;
$\omega = 2\pi f$;
f=the fundamental frequency of an input signal;
t=time;
$v_{in}(t)$=voltage at the input of the LNA; and for a fundamental signal
$v_{in}(t) \propto \sin(\omega t)$
$v_{out}(t) = \sum_{n=1}^{\infty} a_n \cdot v_{in}^n(t) = a_1 \cdot v_{in}^1(t) + a_2 \cdot v_{in}^2(t) + a_3 \cdot v_{in}^3(t) + \ldots =$ voltage at the output of the LNA

TABLE 1

| | |
|---|---|
| DC component | $a_2 \cdot 0.5(\hat{U}_{in,1}^2 + \hat{U}_{in,2}^2)$ |
| Fundamentals | $a_1 \cdot \hat{U}_{in,1} \cdot \sin(\omega_1 t)$ |
| | $a_1 \cdot \hat{U}_{in,2} \cdot \sin(\omega_2 t)$ |
| $2^{nd}$ harmonics | $a_2 \cdot 0.5 \cdot \hat{U}_{in,1}^2 \cdot \cos(2\omega_1 t)$ |
| | $a_2 \cdot 0.5 \cdot \hat{U}_{in,2}^2 \cdot \cos(2\omega_2 t)$ |
| $2^{nd}$ order intermodulation products | $a_2 \cdot \hat{U}_{in,1} \cdot \hat{U}_{in,2} \cdot \cos(\omega_1 - \omega_2)t$ |
| | $a_2 \cdot \hat{U}_{in,1} \cdot \hat{U}_{in,2} \cdot \cos(\omega_1 + \omega_2)t$ |
| $3^{rd}$ harmonics | $a_3 \cdot 0.25 \cdot \hat{U}_{in,1}^3 \cdot \cos(3\omega_1 t)$ |
| | $a_3 \cdot 0.25 \cdot \hat{U}_{in,2}^3 \cdot \cos(3\omega_2 t)$ |
| $3^{rd}$ order intermodulation products | $a_3 \cdot \hat{U}_{in,1}^2 \cdot \hat{U}_{in,2} \cdot 0.75 \cdot \cos(2\omega_1 - \omega_2)t$ |
| | $a_3 \cdot \hat{U}_{in,1}^2 \cdot \hat{U}_{in,2} \cdot 0.75 \cdot \cos(2\omega_2 + \omega_1)t$ |
| | $a_3 \cdot \hat{U}_{in,1} \cdot \hat{U}_{in,2}^2 \cdot 0.75 \cdot \cos(2\omega_1 + \omega_2)t$ |
| | $a_3 \cdot \hat{U}_{in,1} \cdot \hat{U}_{in,2}^2 \cdot 0.75 \cdot \cos(2\omega_1 - \omega_2)t$ |
| | $a_3 \cdot \hat{U}_{in,1} \cdot \hat{U}_{in,2}^2 \cdot 0.75 \cdot \cos(2\omega_2 + \omega_1)t$ |

Furthermore, since the input impedance of the front end amplifier 200-1 can be established at or near the desired system impedance (e.g., 50 Ohms) over the operating frequency range, the noise figure and gain of the front end amplifier 200-1 are not negatively impacted by the use of the degeneration circuit 232 comprising a resonant tank circuit. Accordingly, the bias current can be set to a level that is optimized for front end amplifier 200-1 operation at the best possible noise figure and gain within the operating frequency range.

It should be noted that there is a range of practical values for the inductance of the inductive element 236 and the capacitance of the capacitive element that will result in the desired operating impedance at the operating frequency and the desired high impedance at the third harmonic of the operating frequency. A design tradeoff exists between the size of the inductive element 236 and the capacitive element 238 and the width of the frequency range over which the input impedance of the front end amplifier 200-1 will remain desirable over the entire operating frequency range. It should be noted that the higher the Q of the resonant tank circuit, the greater the rejection at the third harmonic, and thus the more suppression of the gain at the third harmonic and thus the higher the third order intercept point. In addition, a lower Q will mean more resistance. An increase in the resistance through the resonant tank circuit will result in an increase in the noise figure of the LNA.

The inductive reactance of the inductive element is:

$$X_L = 2\pi \ast f \ast L \quad \text{EQ. 1}$$

where f is the frequency and L is the inductance of the inductive element.

the capacitive reactance of the capacitive element is:

$$X_C = 1/(2\pi \ast f \ast C) \quad \text{EQ. 2}$$

where C is the capacitance of the capacitive element.

For a resonant tank circuit the impedance across the parallel circuit is theoretically infinite (an open circuit with infinite Q) at the frequency at which:

$$X_L = X_C \quad \text{EQ. 3}$$

Therefore, the resonant frequency $f_r$ is equal to:

$$f_r = \sqrt{\frac{1}{(4\pi^2 LC)}} \quad \text{EQ. 4}$$

The impedance across the degeneration circuit at the operating frequency $f_o$ is:

$$Z_o = \frac{1}{\sqrt{\left(\frac{1}{2\pi f_o L} - 2\pi f_o C\right)^2}} \quad \text{EQ. 5}$$

It can be seen that by properly selecting the values of the input matching circuit 226, the designer can determine the particular value of $Z_o$ (i.e., the contribution of the degeneration circuit 232) needed to have the input impedance of the front end amplifier 200-1 equal to the operating impedance (e.g., 50 Ohms). Once the value of $Z_o$ is set, the values for L and C will be determined from the simultaneous solution of equations EQ. 4 and EQ. 5 for particular values of $Z_o$, $f_r$ and $f_o$. It should also be noted that the value of $C_{gs}$ of the input FET 202 can be used as an additional variable that affects the relationship between the values of the reactive elements 228, 230 of the input impedance matching circuit 226 and the values of the reactive elements 236, 238 of the tank circuit of the degeneration circuit 232. That is, the input impedance of the front end amplifier 200-1 is a function of the impedance of the input matching circuit 226, the impedance from gate 209 to source 205 of the input FET 202 (the supply current output 217), and the impedance of the degeneration circuit 232. Therefore, the size of the input FET 202 and the particular fabrication process used to produce the input FET 202 provides the designer with another factor that will have an impact on the relationship of the values of the reactive elements 228, 230, 236, 238.

Figure 2B:
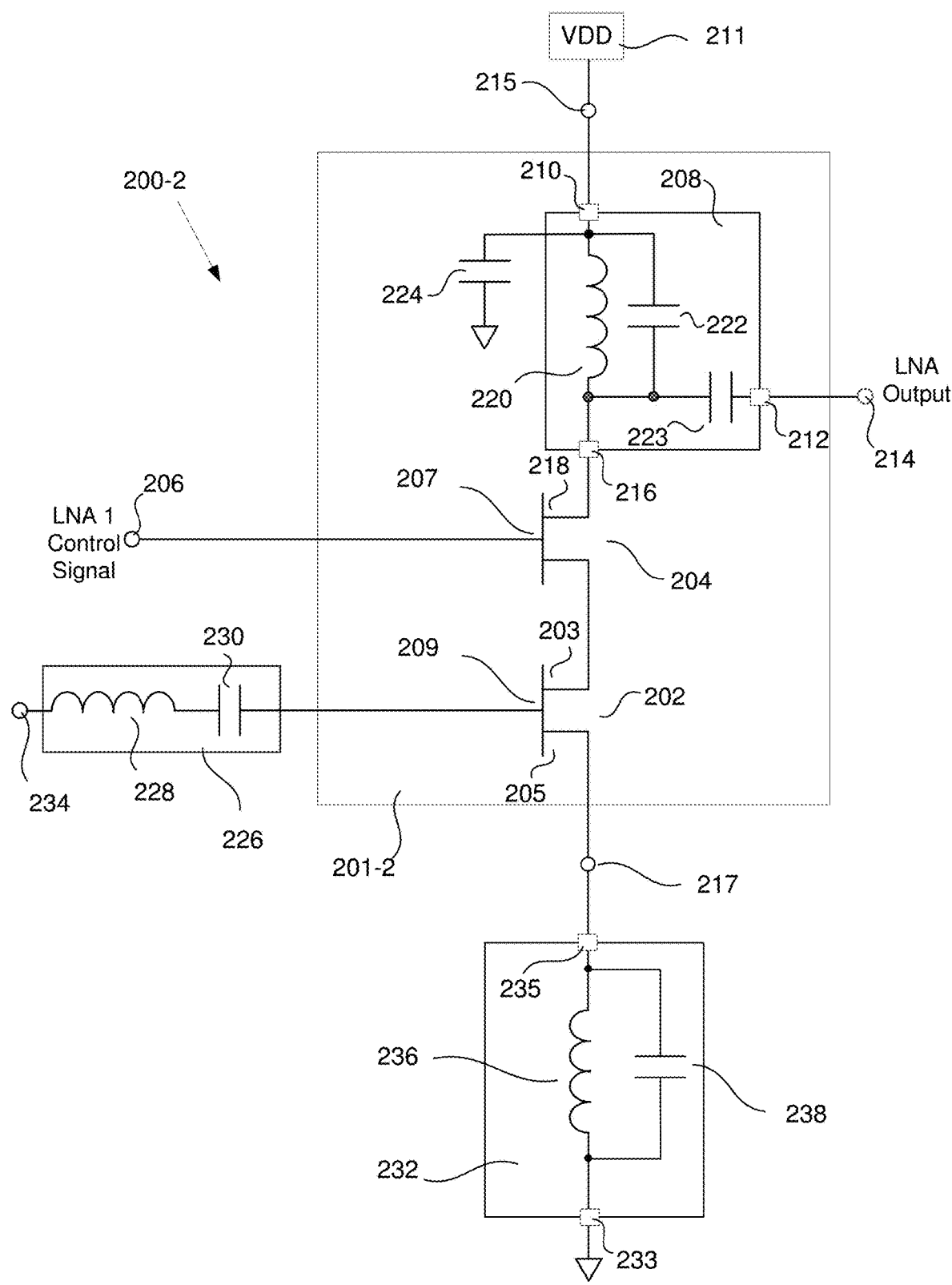
FIG. 2B is an illustration of another front end amplifier of a communications receiver having a tank circuit replacing the source inductor of FIG. 1 to enhance the input third order intercept point (IIP3), the amplifier having an LNA in a cascode arrangement.

FIG. 2B is a simplified schematic of another front end amplifier 200-2 of a communications receiver having an enhanced IIP3 having an LNA 201-2 that comprises a pair of transistors 202, 204. In some such embodiments, the transistors are field effect transistors (FET) 202, 204. In some embodiments, the pair of transistors 202, 204 forms an LNA in a cascode architecture. An LNA control signal is applied to a control input terminal 206 coupled to the gate 207 of the load FET 204 of the LNA 201-2. The state of the LNA control signal applied to the gate 207 of the load FET 204 controls whether the LNA 201-2 is on or off (i.e., whether significant current flows from the drain 203 of the input FET 202 to source 205 of the input FET 202).

Figure 3:
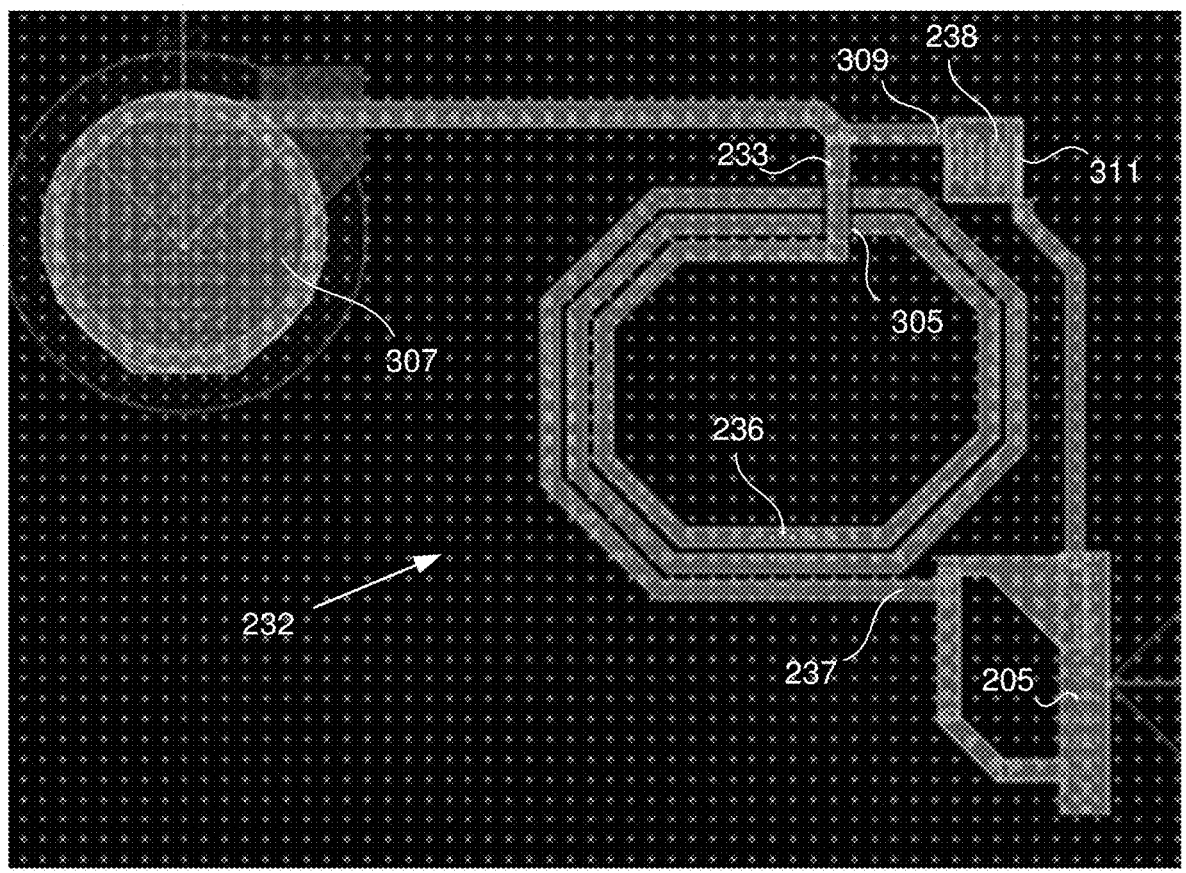
FIG. 3 is an illustration of the layout of the degeneration circuit in accordance with some embodiments of the disclosed method and apparatus.

FIG. 3 is an illustration of the layout of the tank circuit of the degeneration circuit 232 in accordance with some embodiments of the disclosed method and apparatus. The inductive element 236 is shown as being fabricated from a conductor that has been looped two and a half times between the first terminal 233 and the second terminal 235 of the inductive element 236. The conductor crosses from the inside to the outside over two of the loops to get to the first terminal 233. An insulating material 305 is placed between the upper conductor and the lower two conductors. A capacitive element 238 is shown coupled between the first terminal 233 and the second terminal 235 of the inductive element 236, placing the capacitive element 238 in parallel with the inductive element 236. The first terminal 233 of the inductive element 236 and a first terminal 309 of the capacitive element 238 are coupled to a ground structure 307. The second terminal 237 of the inductive element 236 and the second terminal 311 of the capacitive element 238 are coupled to the source 205 of the input FET 202. The particular example shown in FIG. 3 is merely provided as an illustration of one particular layout that might be used to fabricate the tank circuit of the degeneration circuit 232.

Figure 4:
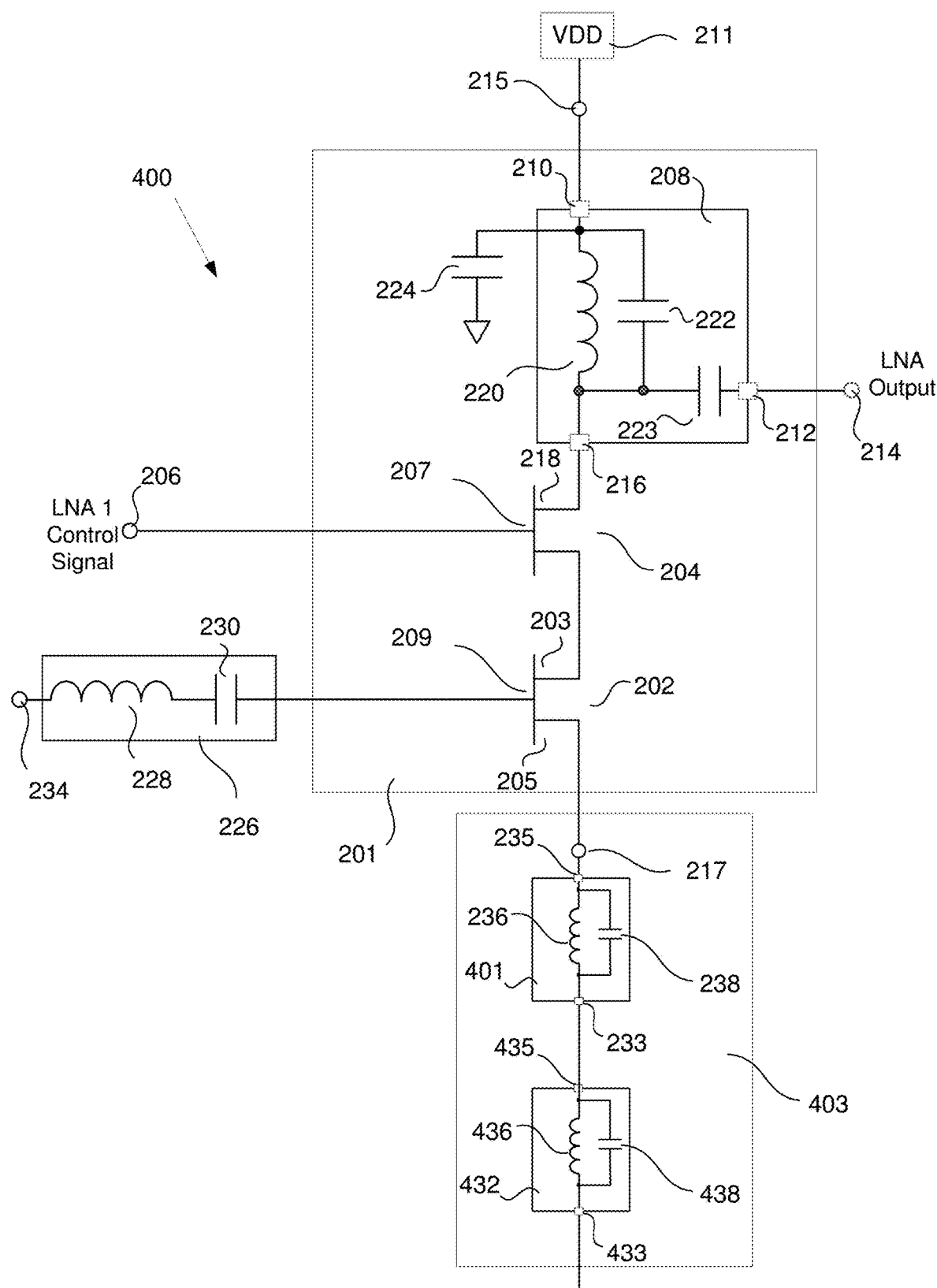
FIG. 4 is a simplified schematic of another embodiment of a front end amplifier coupled to a degeneration circuit that comprises two tank circuits.

FIG. 4 is a simplified schematic of another embodiment of a front end amplifier 400 in accordance with the disclosed method and apparatus. The front end amplifier 400 has a degeneration circuit 403 having two tank circuits 401, 432 coupled in series between the source of the input FET 202 and ground. Each tank circuit 401, 432 are tuned to a unique harmonic. For example, in some embodiments, one of the tank circuits 401 is tuned to the third harmonic of the operating frequency and the other tank circuit 432 is tuned to the second harmonic of the operating frequency. In other embodiments, one or the other of the tanks may be tuned to resonate at a harmonic higher than the $3^{rd}$ harmonic of the operating frequency. Accordingly, the current flowing through the LNA 201-2 will encounter a relatively high impedance at both the second and third harmonic of the operating frequency. In addition, the components of the two tank circuits 401, 432 are tuned to provide a desired degeneration impedance at the source of the input FET 202 at the operating frequency. For example, in some embodiments, the impedance of the series combination of the two tank circuits 401, 432 has an impedance equal to the inductance of the degeneration inductor 124 shown in FIG. 1 at the operating frequency. For example, in some embodiments, the front end amplifier 400 is first designed at the operating frequency to determine the desired degeneration impedance to be provided between the source 205 of the input FET 202 and ground. In some embodiments, the desired impedance at the operating frequency, taken in series with the impedance from the signal input to the supply current output, matches an operating impedance. Each tank circuit 401, 432 can then be designed to provide both a resonance at an associated one of the desired harmonic frequencies and to contribute to a combined impedance at the operating frequency for the series combination of the two tank circuits 401, 432 that is equal to the desired operating degeneration impedance. It should be noted that the particular impedance of the first tank circuit 401 when the second tank circuit 432 is at resonance is not significant, since the path from the source 205 of the input FET 202 to ground will be relatively high due to the resonance of the second tank circuit 432. Additional series degeneration circuits tuned to other harmonics could also be implemented. This could extend to as many tank circuits and harmonics as desired. It should be noted that the tank circuit 432 comprises an inductor 436 and capacitor 438 in parallel between the terminals 435, 433 of the tank circuit 432. However, any tuned circuit having a relatively high impedance at the desired rejection frequency (e.g., at the $2^{nd}$ harmonic) and having an impedance that results in the desired total degeneration impedance can be used.

Figure 5A:
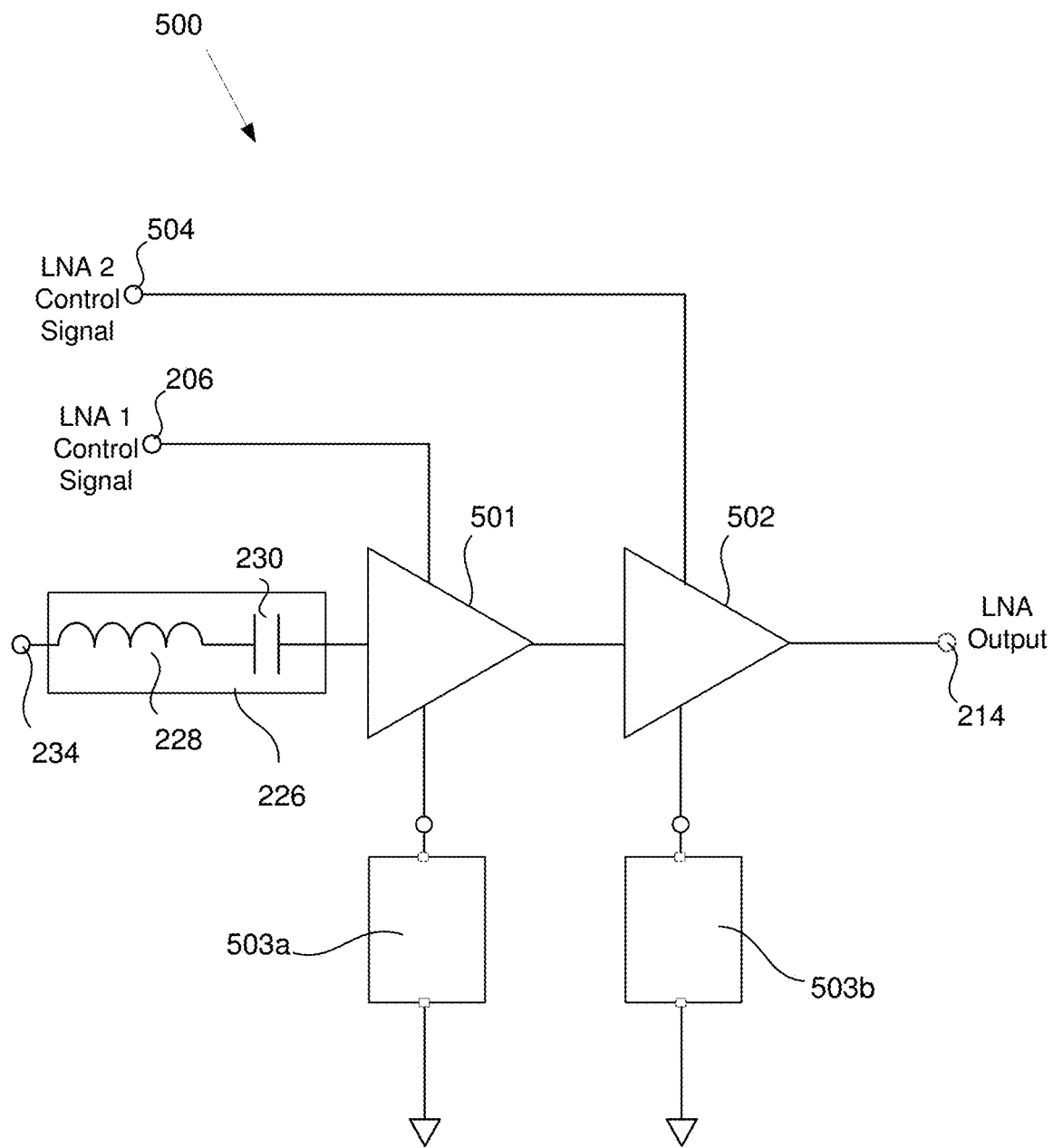
FIG. 5A is a simplified schematic of a front end amplifier in which two stages of amplification are used.

FIG. 5A is a simplified schematic of a front end amplifier 500 in which two stages of amplification are used. In some embodiments, a first stage LNA 501 is provided that is similar to, or the same as, the LNA 201-2 described above with respect to FIG. 4. In some embodiments, the first stage LNA 501 may differ in that the three-port output load matching circuit (not shown in FIG. 5A) provided in the first stage LNA 501 of the front end amplifier 500, may be different from the three-port output load matching circuit 208 provided in the LNA 201-2 (see FIG. 4). That is, since in some embodiments, the input impedance of the second stage LNA 502 is matched to the output impedance to the first stage LNA 501, a different matching network may be more suited to providing the impedance match between the first and second stage LNAs 501, 502. In addition or alternatively, an input matching network (not shown) may be provided within the second stage LNA 502 to assist with the match to the impedance of the output of the first stage LNA 501. Furthermore, in some embodiments, the first stage LNA 501 is coupled to a first degeneration circuit 503a. The second stage LNA 502 is coupled to a second degeneration circuit 503b. It should be noted that the reference number "503" (i.e., without the appended letter "a" or "b") is used when referring to either the first or the second degeneration circuit.

FIGS. 5B-E are simplified schematics of some embodiments of a degeneration circuit 503. The circuits 503-1 thru 503-4 shown in FIGS. 5B-5E may be used in either the first degeneration circuit 503a or the second degeneration circuit 503b. The degeneration circuits 503a, 503b may be the same or each different from the other. Furthermore, the embodiments shown in FIGS. 5B-5E are merely examples of degeneration circuits. Accordingly, other embodiments in which at least one of the two degeneration circuits provide an impedance that substantially reduces the amplifier gain at a harmonic of the operating frequency may be provided.

Figure 5B:
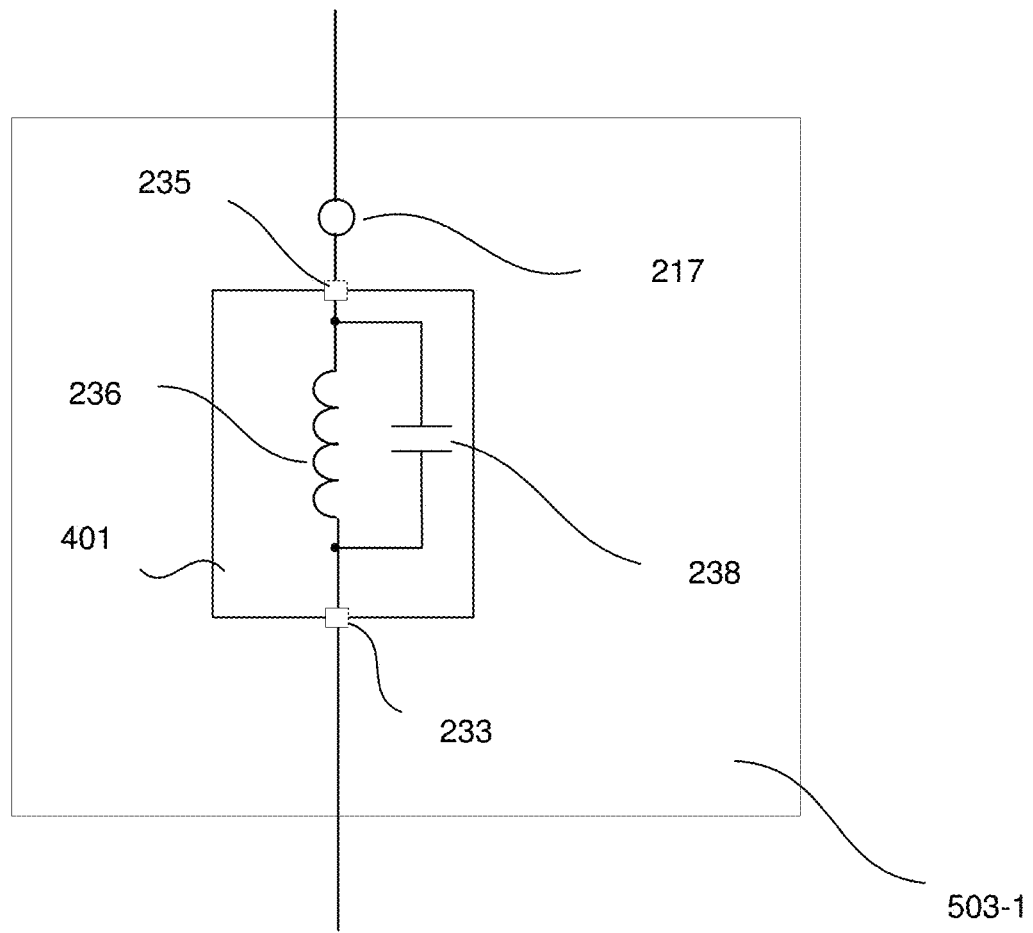
FIG. 5B is a degeneration circuit having a single tank circuit similar to that of the amplifier shown in FIG. 2B.
Figure 5C:
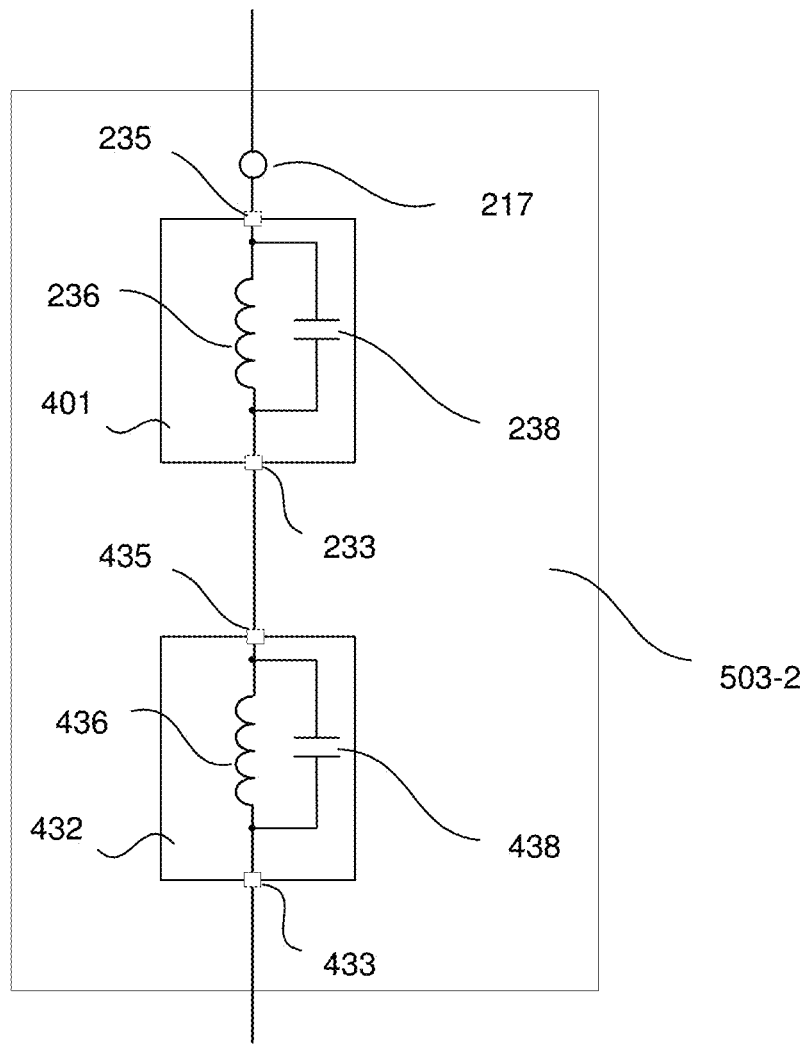
FIG. 5C shows a degeneration circuit having two tank circuits similar to those of the amplifier shown in FIG. 4.
Figure 5D:
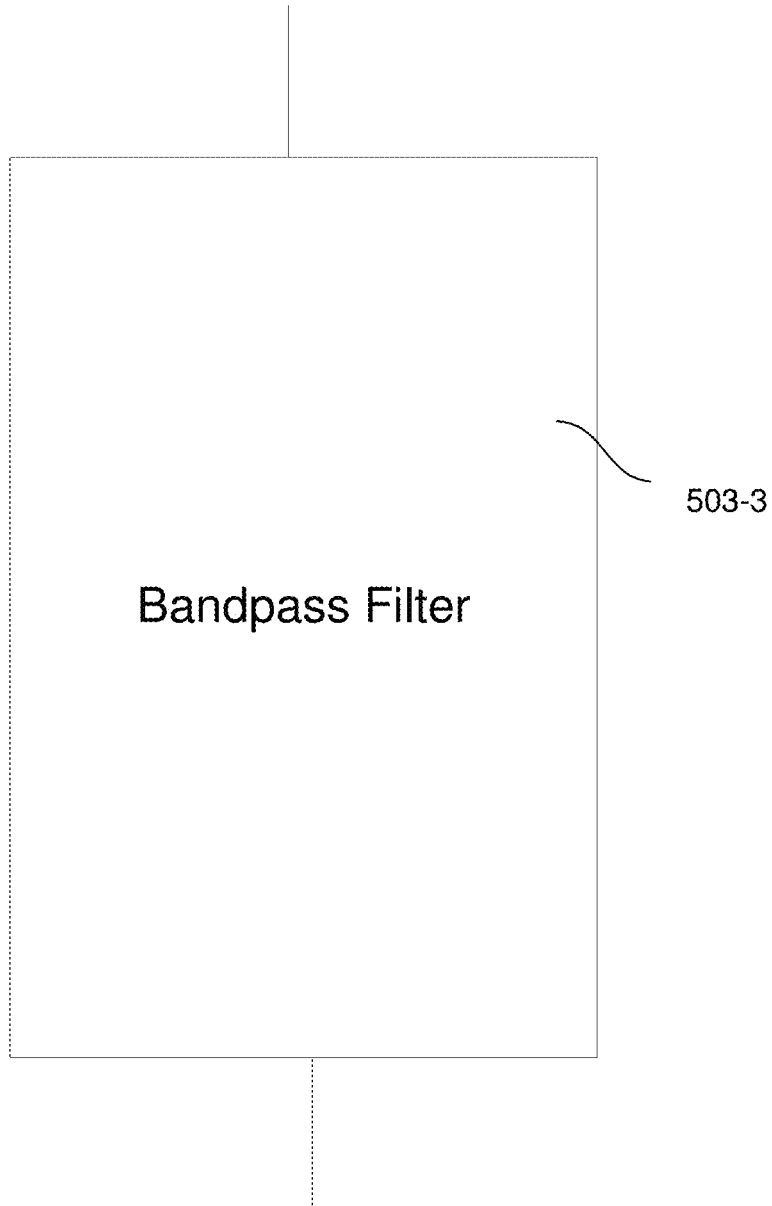
FIG. 5D shows a degeneration circuit having a bandpass filter.

FIG. 5B is a degeneration circuit 503-1 having a single tank circuit 401 similar to that of the amplifier 201-2 shown in FIG. 2B. FIG. 5C shows a degeneration circuit 503-2 having two tank circuits 401, 432 similar to that of the amplifier 400 shown in FIG. 4. FIG. 5D shows a degeneration circuit 503-3 having a bandpass filter. The bandpass filter of the degeneration circuit 503-3 has a passband that includes the operating frequency $f_o$, but which does not include the second harmonic $2f_o$. In an alternative embodiment, the bandpass may include the second harmonic $2f_o$, but doesn't include the third harmonic $3f_o$.

Figure 1:
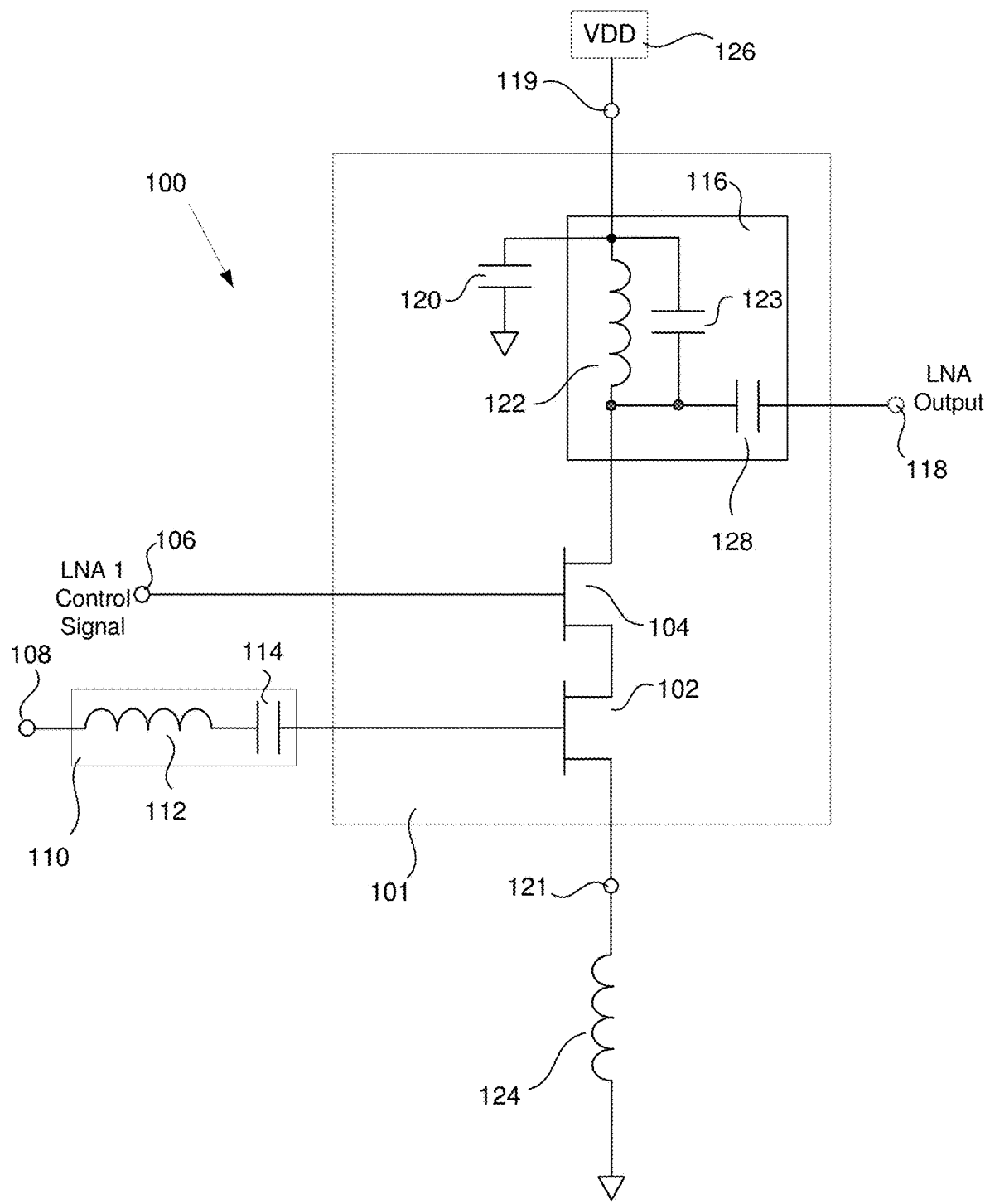
FIG. 1 is an illustration of a portion of a receiver front end in which an inductor is coupled between the source of the input transistor and ground to assist in providing a desirable input impedance at the operating frequency.
Figure 5E:
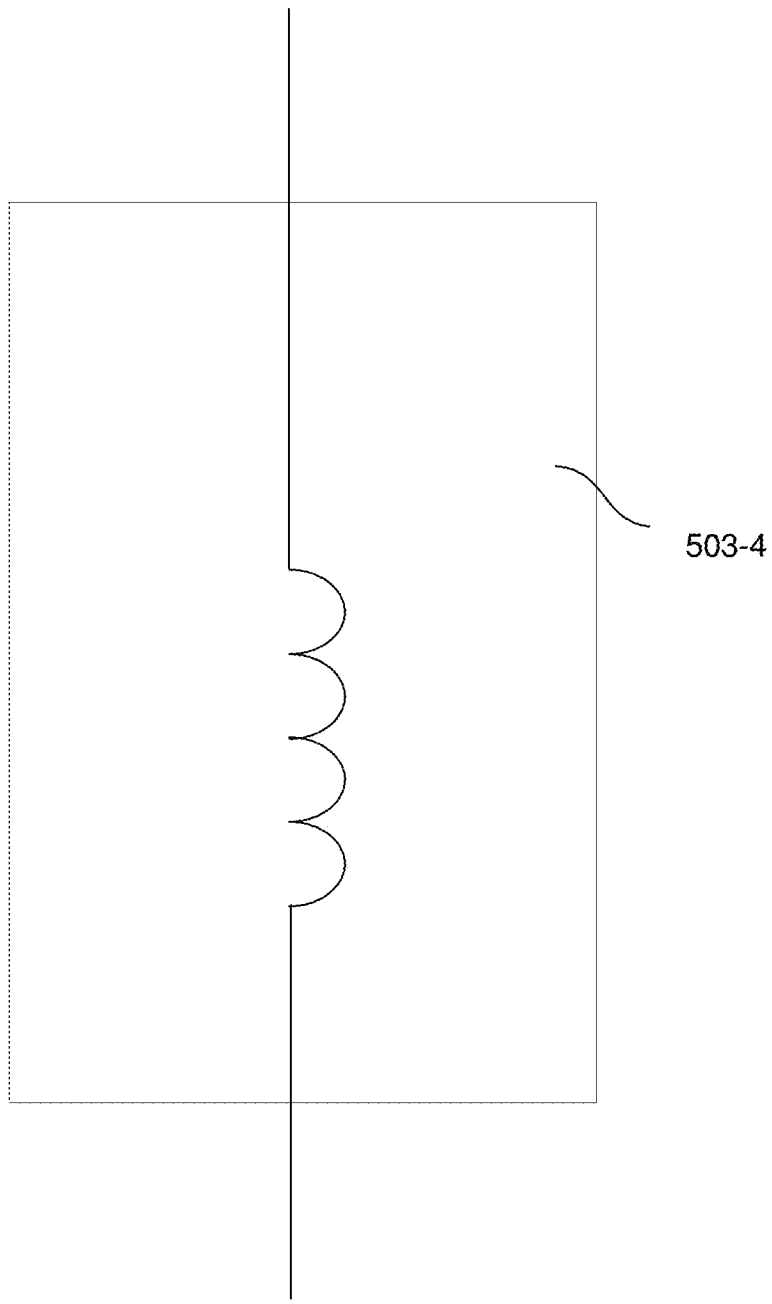
FIG. 5E shows a degeneration circuit that comprises an inductor, similar to the inductor of the amplifier shown in FIG. 1.

Lastly, FIG. 5E shows a degeneration circuit 503-4 that comprises an inductor, similar to the inductor 124 of the amplifier 100 shown in FIG. 1. However, the degeneration circuit 503-4 would only be provided in one of the two degeneration circuits 503a, 503b for a particular embodiment. The other degeneration circuit 503b, 503a may be selected from one of the other embodiments 503-1 thru 503-3, or any other embodiment that provides an impedance that substantially reduces the amplifier gain at a harmonic of the operating frequency.

In some embodiments in which each degeneration circuit 503a, 503b comprises one tank circuit 503-1, the tank circuit within the degeneration circuit 503a coupled to the first stage LNA 501 is tuned to the second harmonic ($2f_o$) of the operating frequency ($f_o$) and the tank circuit 401 within the degeneration circuit 503b coupled with the stage LNA 502 is tuned to the third harmonic ($3f_o$). Alternatively, the tank circuit 503-1 within the degeneration circuit 503a coupled to the first stage LNA 501 is tuned to the third harmonic $3f_o$ and the tank circuit 503-1 within the degeneration circuit 503b coupled to the first stage LNA 501 is tuned to the second harmonic $2f_o$.

Alternatively, in embodiments in which the degeneration circuit 503-2 have more than one tank circuit 401, 432 associated with each stage LNA 501, 502, the tank circuit 401, 432 may be tuned to a different resonant frequencies. For example, the first tank circuit 401 within the degeneration circuit 503a coupled to the first stage LNA 501 may be tuned to resonate at the second harmonic ($2f_o$) of the operating frequency ($f_o$); the second tank circuit 432 within the first degeneration circuit 503a coupled to the first stage LNA 501 may be tuned to resonate at the third harmonic ($3f_o$); the first tank circuit 401 within the second degeneration circuit 503b coupled to the second stage LNA 502 may be tuned to resonate at the fourth harmonic ($4f_o$); and the second tank circuit 432 in the second degeneration circuit 503b coupled to the second stage LNA 502 may be tuned to resonate at the fifth harmonic ($5f_o$). Other combinations of degeneration circuits 503-1 through 503-4 implemented in each degeneration module 503a, 503b may be used in which the tank circuits (where present) are tuned to different combinations of harmonics, including, but not limited to, the 2nd harmonic through the $5^{th}$ harmonic of the operating frequency.

The following table shows some such combinations (others not show are possible):

TABLE 2

| First Degeneration Circuit (503a) | Second Degeneration Circuit (503b) |
|---|---|
| One Tank Circuit (503-1) tuned to $3f_o$ | One Tank Circuit (503-1) tuned to $2f_o$ |
| One Tank Circuit (503-1) tuned to $2f_o$ | One Tank Circuit (503-1) tuned to $3f_o$ |
| One Tank Circuit (503-1) tuned to $3f_o$ | One Tank Circuit (503-1) tuned to $3f_o$ |
| One Tank Circuit (503-1) tuned to $3f_o$ | Inductor (503-4) |
| Two Tank Circuits (503-2) tuned to $2f_o$ & $3f_o$ | Two Tank Circuits (503-2) tuned to $4f_o$ & $5f_o$ |
| One Tank Circuit (503-1) tuned to $2f_o$ | Inductor (503-4) |

Methods

Figure 6:
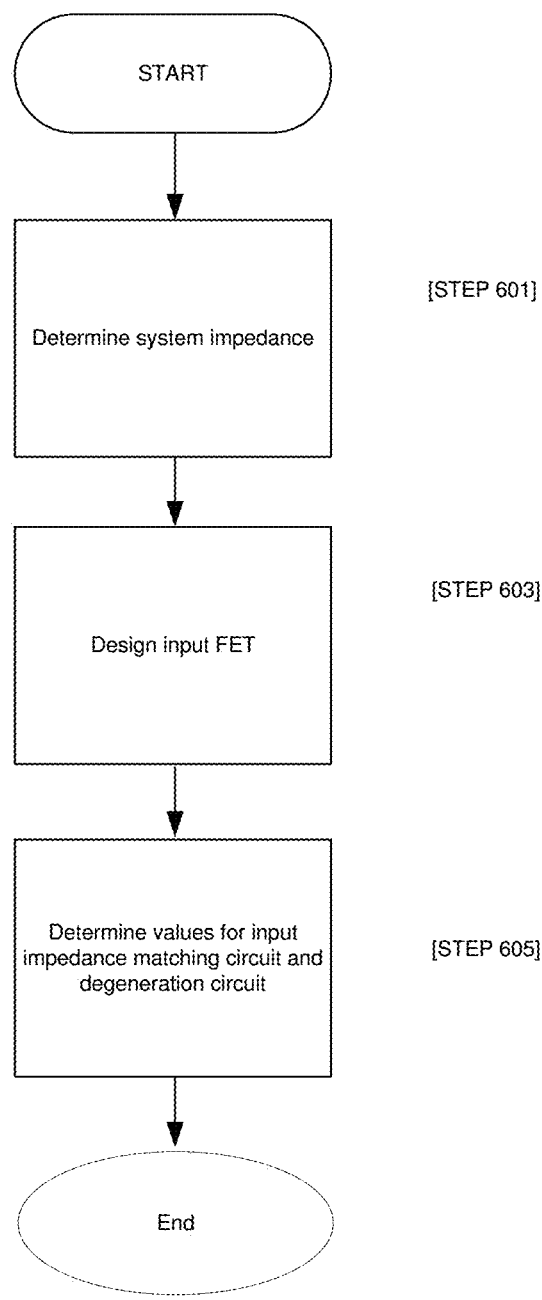
FIG. 6 is an illustration of a method in accordance with one embodiment for fabricating an LNA having improved IIP3.

FIG. 6 is an illustration of a method in accordance with one embodiment for fabricating an LNA having improved IIP3. The method starts with determining the system impedance (STEP 601). For example, in some embodiments, the system impedance is determined to be 50 Ohms. Accordingly, both the input impedance of the LNA and the output impedance of the input signal source will be 50 Ohms. In other embodiments, the input impedance and the output impedance may be different. Next, an input FET is designed for use in the LNA (STEP 603). The design of the input FET determines the parameters of the FET that are desired for the particular application for which the LNA will be used. The FET parameters might include the dimensions of the input FET and the particular fabrication process that is to be used to fabricate the input FET. Next, the values for components in an input impedance matching circuit and degeneration circuit are determined (STEP 605). The values of the these two circuits are determined to provide an input impedance at the input to the front end amplifier that is equal to the system impedance at the operating frequency for which the front end amplifier is being designed. In addition, the values of the components of these two circuits also provide a relatively high impedance at a harmonic of the operating frequency. In some embodiments, the harmonic is the second harmonic, the third harmonic, or a harmonic higher than the third harmonic. It should be understood that the particular steps of the process 600 may be performed in any order. The same process is followed for the case in which the amplifier is to have two or more stages, except that STEPs 603 and 605 are repeated for each stage of the amplifier.

Figure 7:
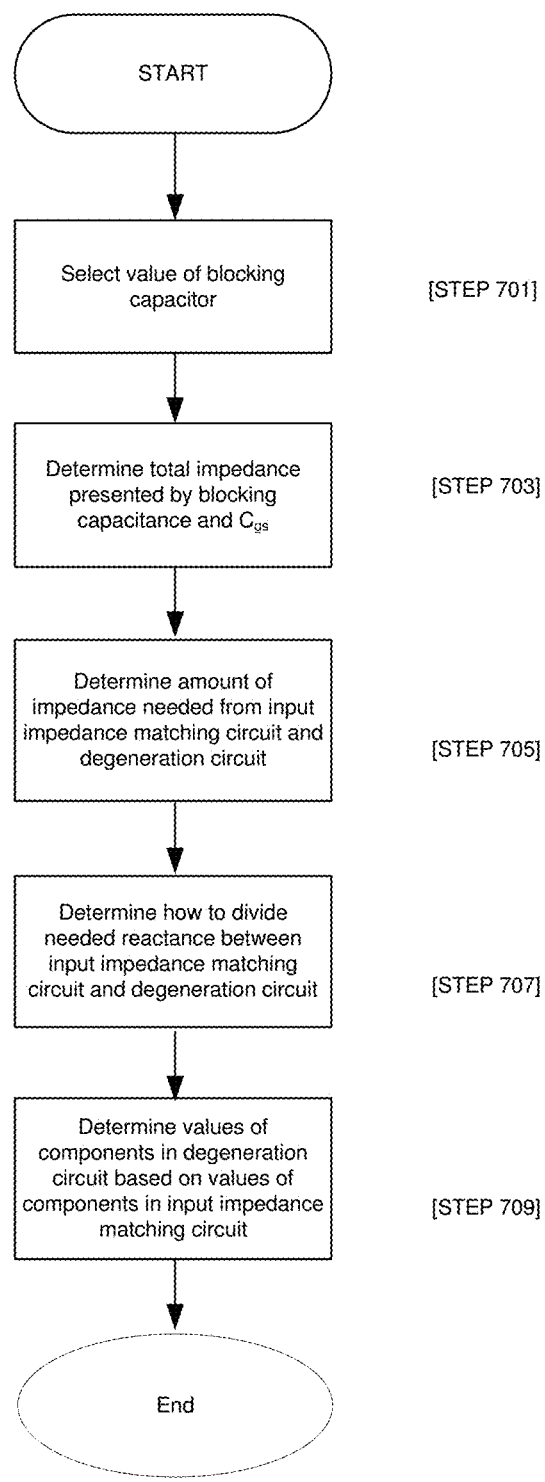
FIG. 7 is an illustration of some of the details of the method shown in FIG. 6.

FIG. 7 is an illustration of some of the details of the method 600 shown in FIG. 6. In particular, FIG. 7 illustrates an example of one way in which the values of the components determined in STEP 605 are determined. It should be understood that several other ways may be possible. Furthermore, the process need not be performed in the particular order described in FIG. 7.

The method of FIG. 7 starts with the selection of a value for a blocking capacitor within the input impedance matching circuit (STEP 701). The total impedance of the series combination of the blocking capacitor and the gate-to-source capacitance Cgs of the input FET are then determined (STEP 703). Once the impedance of the combination is determined in STEP 703, the amount of reactance (either inductive or capacitive reactance) that is needed to establish the desired front end amplifier input impedance is determined. That is, the amount of inductive or capacitive reactance needed to be placed in series with the blocking capacitance and the gate-to-source junction of the input FET to establish an input impedance for the front end amplifier at the operating frequency is determined (STEP 705). Next, a determination is made as to how to divide the required additional series reactance between an inductor within the input impedance matching circuit and the degeneration circuit (STEP 707). Based on the amount of inductance provided by the input impedance matching circuit and the amount of inductance provided by the degeneration circuit, the values of capacitance and inductance in a tank circuit of the degeneration circuit are determined. The determination is made to provide the desired reactance (in some cases inductive reactance) at the operating frequency to cause the input impedance of the front end amplifier to be equal to the operating impedance. Furthermore, the values are selected to provide a high impedance to be presented by the degeneration circuit at the desired harmonic of the operating frequency (STEP 709).

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the inventive concepts claimed may be particularly useful with an SOI-based fabrication process (including SOS), and with fabrication processes having similar characteristics.

Circuits and devices in accordance with the above disclosed method and apparatus may be used alone or in combination with other components, circuits, and devices. Embodiments of the disclosed method and apparatus may be fabricated as integrated circuits (ICs), which may be encased in IC packages and/or or modules for ease of handling, manufacture, and/or improved performance. It should be noted that discrete components may also be used. In some embodiments, components may be fabricated on a laminate, Low Temperature Co-fired Ceramic (LTCC) or other substrate structure.

Embodiments of the disclosed method and apparatus are useful in a wide variety of receivers. Such receivers are useful in a variety of applications, such as radar systems (including phased array and automotive radar systems), radio systems (including cellular radio systems), and test equipment. Such circuits may be useful in systems operating over some or all of the RF range (e.g., from around 20 kHz to about 300 GHz).

Radio systems include both wired and wireless RF systems (including base stations, network components, relay stations and hand-held transceivers) that use various technologies and protocols, including various types of orthogonal frequency-division multiplexing ("OFDM"), quadrature amplitude modulation ("QAM"), Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), Multimedia over Coaxial Alliance ("MOCA"), as well as other wired and wireless communication standards and protocols.

Figure 8:
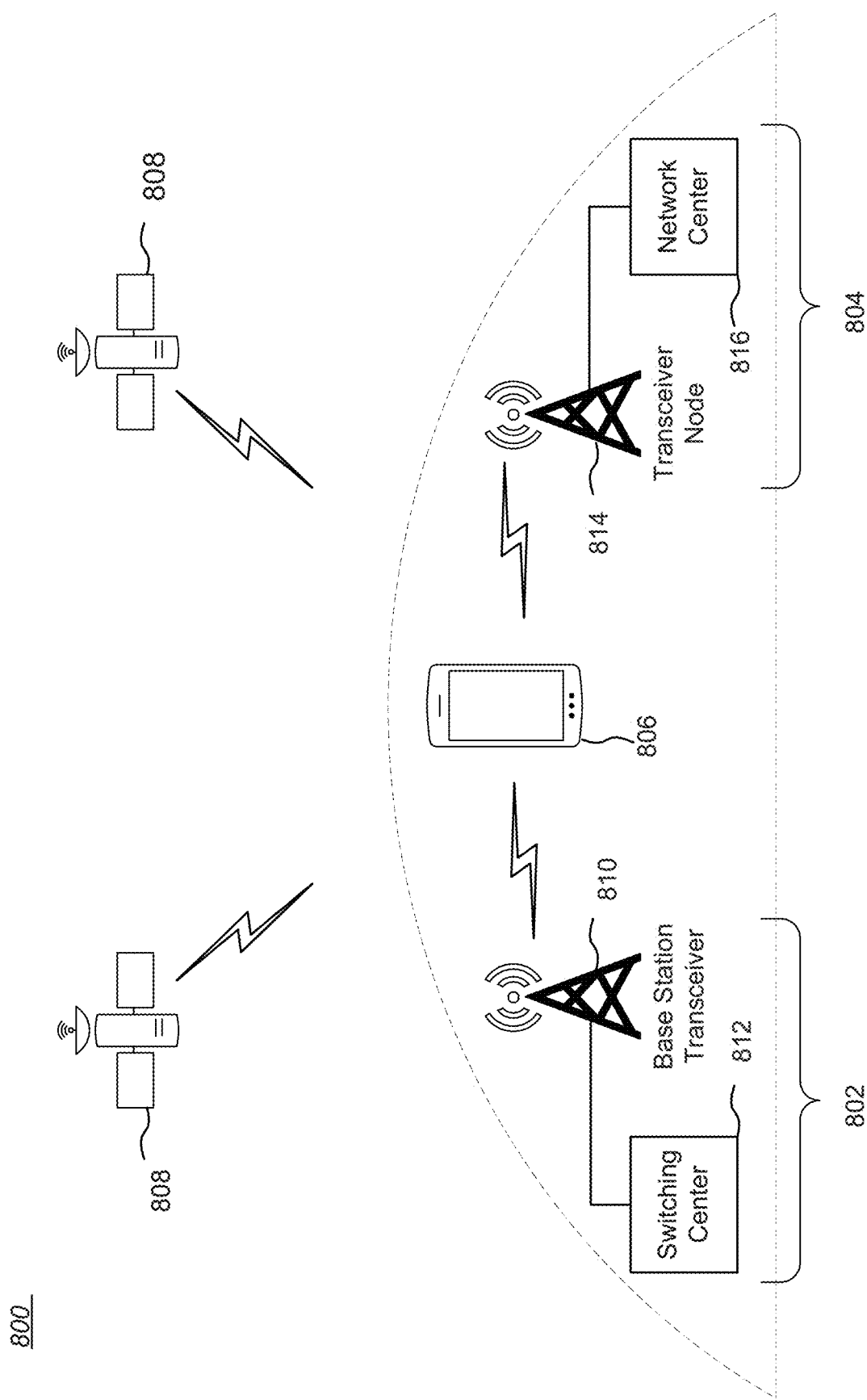
FIG. 8 is an illustration of an example of an environment comprising different wireless communication systems.

FIG. 8 is an illustration of an example of an environment comprising different wireless communication systems 802 and 804. As will be seen below, receivers in each of the components of the system 800 may include the front end amplifier 200 described above.

The environment of FIG. 8 may include one or more mobile wireless devices 806. In some embodiments, the wireless device 806 is capable of communicating with multiple wireless communication systems 802, 804 using one or more of the telecommunication protocols noted above. In some embodiments, the wireless device 806 is also/alternatively capable of communicating with one or more satellites 808, such as navigation satellites (e.g., GPS) and/or telecommunication satellites. The wireless device 806 may be equipped with multiple antennas, externally and/or internally, for operation on different frequencies and/or to provide diversity against deleterious path effects, such as fading and multi-path interference. The wireless device 806 may be a cellular phone, wireless-enabled computer or tablet, or other wireless communication unit or device. In some embodiments, the wireless device 806 may be referred to as a mobile station, user equipment, access terminal, or by other terminology.

In some embodiments, the wireless system 802 is a TDD-based system that includes one or more base station transceivers (BSTs) 810 and at least one switching center (SC) 812. Each BST 810 provides over-the-air RF communication for wireless devices 806 within its coverage area. The SC 812 couples to one or more BSTs in the wireless system 802 and provides coordination and control for those BSTs.

The wireless system 804 may be, for example, a FDD-based system that includes one or more transceiver nodes 814 and a network controller (NC) 816. Each transceiver node 814 provides over-the-air RF communication for wireless devices 806 within its coverage area. The NC 816 couples to one or more transceiver nodes 814 in the wireless system 804 and provides coordination and control for those transceiver nodes 814.

In general, each BST 810 and transceiver node 814 is a fixed station that provides communication coverage for wireless devices 806, and may also be referred to as base stations or some other terminology. The SC 812 and the NC 816 are network entities that provide coordination and control for the base stations and may also be referred to by other terminologies.

Figure 9:
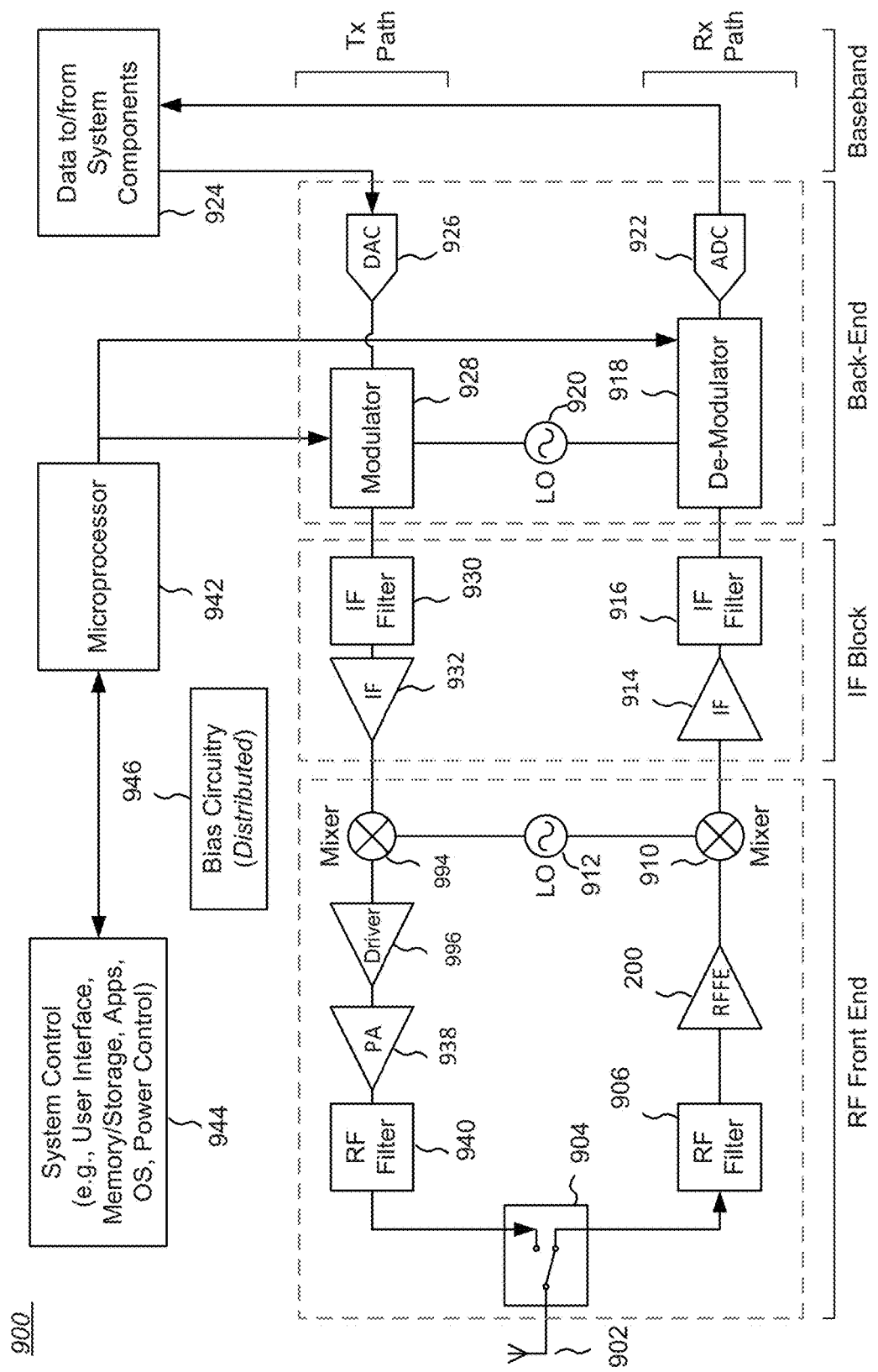
FIG. 9 is a block diagram of a transceiver having a wireless device comprising a front end amplifier with an LNA that has improved IIP3.

FIG. 9 is a block diagram of a typical prior art transceiver 900 that might be used in a wireless device 910, such as the wireless device 806. As illustrated, the transceiver 900 includes RF circuitry for directly conveying and/or transforming signals. In addition, circuity is shown outside of the RF signal path for providing support functionality to the RF circuity (e.g., for bias voltages and switching signals). Still further, digital circuitry is shown for providing control and user interface functionality. In this example, a receiver (RX) path includes an RF Front End, an IF Block, Back-End, and a Baseband section. In some implementations, the differentiation between portions of the RX path may be different that described herein).

The RX path receives signals through an antenna 902. The antenna 902 provides received signals to a switching unit 904. The switching unit 904 may be implemented with active switching devices (e.g., field effect transistors or FETs) or with passive devices. In some embodiments, the switching unit 904 may be a diplexer or duplexer implementing frequency domain multiplexing. An RF filter 906 passes desired received RF signals to the RF front end (RFFE) amplifier 200. The output of the RFFE amplifier 200 coupled to a mixer 910. A first local oscillator 912 is also coupled to the mixer 910 to downconvert the front end amplifier output to an intermediate frequency (IF) signal. In some embodiments, the IF signal is amplified by an IF amplifier 914. The output of the IF amplifier 914 is coupled to an IF filter 916, the output of which is coupled to the input of a demodulator 918. In some embodiments, the demodulator 918 is coupled to a second local oscillator 920. The demodulated output of the demodulator 918 is converted to a digital signal by an analog-to-digital converter (DAC) 922. The output of the DAC 922 is provided to one or more system components 924 (e.g., a video graphics circuit, a sound circuit, memory devices, etc.). In some such embodiments, the converted digital signal represents video, still images, sounds or symbols (such as text or other characters).

In the illustrated system 900, a transmitter (TX) path includes a Baseband section, a Back-End, an IF Block, and a RF Front End. Similar to the RX path, in some implementations, the differentiation between the designated portions of the RX path may be different. Digital data from one or more system components 924 is converted to an analog signal by a digital-to-analog converter (ADC) 926. The output of the ADC 926 is applied to a modulator 928. In some embodiments, the second local oscillator 920 is coupled to the modulator 928 to modulate the analog signal. The modulated analog signal is coupled to an IF filter 930. The output of the filter 930 is then amplified by an IF amplifier 932. The output of the IF amplifier 932 is upconverted to an RF signal in a mixer 934 to which the output of the first local oscillator 912 is coupled. The RF signal may be amplified by a preamplifier 936. The output of the preamplifier 936 is applied to a power amplifier (PA) 938. In some embodiments, the preamplifier may benefit from having a resonant tank circuit as described above to improve the linearity of the amplifier gain. In some embodiments, the amplified RF signal is coupled to an RF filter 940. The output of the filter 940 transmitted by the antenna 902, which receives the signal via the switching unit 904.

In some embodiments, the operation of the transceiver 900 is controlled by a microprocessor 942 in known fashion.

In particular, the microprocessor 942 is coupled to, and controls the functions of, system control components. Such system control components include such things as user interfaces, memory/storage devices, application programs, operating system software, power control, etc. In addition, the transceiver 900 may include other circuitry, such as bias circuitry 946 (which may be distributed throughout the transceiver 900 in proximity to transistor devices), electrostatic discharge (ESD) protection circuits, testing circuits (not shown), factory programming interfaces (not shown), etc.

In modern transceivers, there are may be more than one RX path and TX path. For example, separate paths may be provided to accommodate multiple frequencies and/or signaling modalities. Further, as should be apparent to one of ordinary skill in the art, some components of the transceiver 900 may be in a positioned in a different order (e.g., filters). Other components can be added, such as additional filters, impedance matching networks, variable phase shifters/attenuators, power dividers, etc.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A front end amplifier comprising:
   (a) an amplifier having at least a signal input, a signal output, a supply current input and a supply current output;
   (b) a supply voltage source coupled to the supply current input;
   (c) a first degeneration circuit coupled between the supply current output and ground, the first degeneration circuit tuned to have an impedance at an operating frequency that, taken in series with the impedance from the signal input to the supply current output, matches an operating impedance and that has a relatively high impedance at a first frequency, the first frequency being a harmonic of the operating frequency; and wherein the first degeneration circuit comprises a first tank circuit tuned to resonate at the first frequency, and
   (d) a second tank circuit coupled in series with the first tank circuit, the second tank circuit tuned to have an impedance at an operating frequency that, taken in series with the impedance from first tank circuit and the impedance from the signal input to the supply current output, matches an operating impedance and that is in resonance at a second frequency that is a unique harmonic of the operating frequency.

2. The front end amplifier of claim 1, further comprising additional tank circuits, each coupled in series with the first and second tank circuits, each being in resonance at a unique harmonic of the operating frequency such that each tank circuit resonates at a different harmonic and each additional tank circuit having an impedance at the operating frequency that when taken in series with each other degeneration circuit and in series with the impedance from the signal input to the supply current output, matches an operating impedance.

3. The front end amplifier of claim 1, wherein the front end amplifier includes at least two transistors configured as a cascode.

4. The front end amplifier of claim 3, further comprising an output load matching circuit:
   wherein the transistors of the cascode include at least output load field effect transistor (FET) and an input FET, a drain of the load FET being coupled to the supply current input, a source of the load FET being coupled to the drain of the input FET, the gate of the input FET being coupled to the signal input; and
   wherein the output load matching circuit has a first connection to the supply current input, a second connection to the drain of the load FET and a third connection to the signal output.

5. The front end amplifier of claim 4, further comprising an input impedance matching circuit.

6. The front end amplifier of claim 5, wherein the input impedance matching circuit includes at least a first inductive element and at least a first capacitive element.

7. The front end amplifier of claim 6, wherein the first inductive element and the first capacitive element are in series.

8. The front end amplifier of claim 7, wherein the output load matching circuit includes at least a first inductive element and at least a first capacitive element coupled between the first connection and the second connection.

9. The front end amplifier of claim 8, wherein the first inductive element and the first capacitive element are in parallel between the first connection and the second connection.

10. The front end amplifier of claim 9, wherein the output load matching circuit further includes a capacitive element coupled between the third connection of the output load matching circuit and the parallel coupled first inductive element and first capacitive element.

11. A front end amplifier comprising:
    (a) an amplifier having at least a signal input, a signal output, a supply current input and a supply current output;
    (b) a supply voltage source coupled to the supply current input;
    (c) a first degeneration circuit coupled between the supply current output and ground, the first degeneration circuit tuned to have an impedance at an operating frequency that, taken in series with the impedance from the signal input to the supply current output, matches an operating impedance and that has a relatively high impedance at a first frequency, the first frequency being a harmonic of the operating frequency;
    (d) a first stage low noise amplifier (LNA);
    (e) a second stage LNA having a second supply current input coupled to the supply voltage source;
    (f) a second supply current output coupled to the second stage LNA; and
    (g) a second degeneration circuit coupled between the second supply current output and ground; and
    wherein at least one of the degeneration circuits comprises a tank circuit tuned to a harmonic of the operating frequency of the front end amplifier.

12. The front end of claim 11, wherein each degeneration circuit comprises a tank circuit tuned to a unique harmonic of the operating frequency of the front end amplifier.

13. The front end of claim 11, wherein at least one degeneration circuit comprises two tank circuits, each tuned to a unique harmonic of the operating frequency of the front end amplifier.

14. A method for fabricating a front end amplifier, comprising:
  (a) determining a system impedance and an operating frequency;
  (b) determining operational characteristics of an input FET, comprising at least an impedance from gate to source of the input FET when operating as an amplifier within the front end amplifier at the operating frequency;
  (c) determining a total impedance required for an input impedance matching circuit and a degeneration circuit at the operating frequency, such that the series combination of: (i) the impedance from gate to source of the input FET, (ii) the impedance of the input impedance matching circuit and (iii) the impedance of the degeneration circuit are equal to the system impedance at the operating frequency;
  (d) determining a ratio of impedance between the input impedance matching circuit and the degeneration circuit at the operating frequency;
  (e) based on the ratio, determining a value for the impedance of the degeneration circuit at the operating frequency; and
  (f) determining values of capacitance and inductance for elements of a tank circuit within the degeneration circuit such that the tank circuit in the degeneration circuit is near resonance at a first frequency, the first frequency being a harmonic of the operating frequency and such that the tank circuit provides the determined value for the impedance of the degeneration circuit at the operating frequency.

15. The method of claim 14, wherein the harmonic is the third harmonic of the operating frequency.

16. The method of claim 14, wherein the harmonic is the second harmonic of the operating frequency.

17. The method of claim 14, wherein the harmonic is a harmonic of the operating frequency higher than the third harmonic.

18. The method of claim 14, wherein determining the operational characteristics of the input FET include at least determining the dimensions of the input FET and the fabrication process used to fabricate the FET.

19. The method of claim 18, wherein determining total impedance required for an input impedance matching circuit and a degeneration circuit at an operating frequency further includes:
  (a) determining a gate to source capacitance of the input FET,
  (b) determining a value of a blocking capacitor within the input impedance matching circuit; and
  (c) based on the gate to source capacitance of the input FET, and based on the determination of the value of the blocking capacitor, and further based on the ratio of impedance between the input impedance matching circuit and the degeneration circuit at the operating frequency, determining the value of the components of the tank circuit within the degeneration circuit and the value of an inductor within the input impedance matching circuit.

* * * * *